(12) United States Patent
Muhammad et al.

(10) Patent No.: US 9,450,798 B2
(45) Date of Patent: Sep. 20, 2016

(54) TRANSMITTER CIRCUIT, COMMUNICATION UNIT AND METHOD FOR AMPLIFYING A COMPLEX QUADRATURE SIGNAL

(71) Applicant: MEDIATEK INC., Hsin-Chu (TW)

(72) Inventors: Khurram Muhammad, Winston-Salem, NC (US); Chih-Ming Hung, Mckinney, TX (US)

(73) Assignee: Mediatek, Inc., Hsin-Chu (TW)

( * ) Notice: Subject to any disclaimer, the term of this patent is extended or adjusted under 35 U.S.C. 154(b) by 0 days.

(21) Appl. No.: 14/923,428

(22) Filed: Oct. 26, 2015

(65) Prior Publication Data

US 2016/0127164 A1 May 5, 2016

Related U.S. Application Data

(60) Provisional application No. 62/069,852, filed on Oct. 29, 2014.

(51) Int. Cl.
*H04L 25/49* (2006.01)
*H04L 27/26* (2006.01)
*H04B 1/04* (2006.01)

(52) U.S. Cl.
CPC ......... *H04L 27/2623* (2013.01); *H04B 1/0475* (2013.01); *H04B 2001/0408* (2013.01); *H04B 2001/0491* (2013.01)

(58) Field of Classification Search
CPC ... H04L 5/0053; H04L 27/26; H04L 27/368; H04L 27/265; H03F 1/3247; H03F 2200/336
USPC ......... 375/297, 130, 329, 341, 343; 445/561
See application file for complete search history.

(56) References Cited

U.S. PATENT DOCUMENTS

| | | | | |
|---|---|---|---|---|
| 6,977,972 B1* | 12/2005 | Kandala | ................ | H04L 25/067 375/324 |
| 7,921,351 B2* | 4/2011 | Williams | .............. | H04L 1/0045 714/760 |
| 2011/0013729 A1* | 1/2011 | Yuba | ................... | H04L 27/2613 375/329 |
| 2011/0064155 A1* | 3/2011 | Ashita | ................... | H03F 1/3247 375/260 |

* cited by examiner

*Primary Examiner* — Khai Tran
(74) *Attorney, Agent, or Firm* — Optimus Patents US, LLC

(57) ABSTRACT

A transmitter circuit includes a frequency generation circuit configured to generate a local oscillator signal and a digital modulator configured to: receive data to be transmitted; quadrature modulate the received data to at least a first, Q, modulated value and a second, I, modulated value; examine the quadrature modulated data to determine if the first, Q, modulated value exceeds a limit, and in response thereto selectively modify the quadrature modulated values to a first modified, Q', modulated value and a second modified, I', modulated value thereby bringing only a value of the first modified, Q', modulated value to within the limit. A local oscillator phase is selected in order to map the first modified, Q', modulated value and second modified, I', modulated value to desired quadrature values. A digital power amplifier, DPA, coupled to the digital quadrature modulator, is configured to amplify the quadrature modified modulated data.

19 Claims, 11 Drawing Sheets

TRANSMITTER CIRCUIT, COMMUNICATION UNIT AND METHOD FOR AMPLIFYING A COMPLEX QUADRATURE SIGNAL

CROSS REFERENCE TO RELATED APPLICATIONS

This application claims the benefit of U.S. provisional application No. 62/069,852, filed on Oct. 29, 2014 and incorporated herein by reference.

BACKGROUND

1. Field of the Invention

The field of this invention relates to a transmitter circuit, a communication unit, and a method for amplifying a complex quadrature signal, and in particular a mechanism for amplifying a complex quadrature signal using a digital power amplifier.

2. Background of the Invention

In telecommunications, there has been a recent trend for device manufacturers to design wireless communication units that are capable of operating over multiple frequency bands, to enable the same device to operate in different geographical regions, as well as being able to switch between different service providers and different communication technologies. Hence, in the field of wireless (e.g., Radio Frequency (RF)) communication units, architectures for supporting communications across multiple and various frequencies have been developed, particularly in supporting high data rates that require wideband methodologies. A primary focus and application of the present invention is the field of RF power amplifiers capable of use in wireless telecommunication applications. Continuing pressure on the limited spectrum available for radio communication systems, particularly in supporting increasingly higher data rates, is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier, often referred to as linear transmitters.

In the field of linear transmitter techniques, digital power amplifiers (PAs), PA drivers and wireless local area network (WLAN) PAs are typically either IQ based transmitter designs or polar transmitter designs. It is known that digital polar transmitter designs can provide great efficiencies. However, the conversion from the digital (I, Q) signal to a RF version of the signal that exhibits amplitude modulation and phase modulation (AM, PM) tends to cause bandwidth expansion on amplitude modulation and phase modulation paths. However, it is also known that polar transmitter designs are impractical for wideband implementations, such as high modulation bandwidths supported by future communication standards, e.g. fourth generation (4G) standards.

A second known linear transmitter architecture is that of a digital quadrature (IQ) transmitter, as illustrated in FIG. 1. Digital IQ transmitter architectures support wide bandwidth modulation standards. However, digital IQ transmitter architectures introduce a significant efficiency loss due to quadrature power combining. In FIG. 1, there is illustrated an example of a simplified block diagram of part of a digital quadrature (IQ) power amplifier (PA) 100. The IQ PA 100 comprises a first (in-phase) array 115 of, say, switch-mode power cells 130 and a second (quadrature) array 120 of switch-mode power cells. The IQ PA 100 is configured to receive an IQ (In-phase/Quadrature) input signal comprising a first (In-phase) signal component 106 provided by first multiplexer (e.g. phase selector) 105 and a second (Quadrature) signal component 108 provided by a second multiplexer (e.g. phase selector) 110. The various signals can be selected based on the timing waveform of the 'I' and 'Q' signals in timing diagram 170. The 'high' portions of the respective waveforms identify the drive phases of the local oscillator inputs that may be selected for being applied to either DPA. The respective multiplexers 105, 110 are provided with independent local oscillator (radio frequency) inputs I-LO+, I-LO−, Q-LO+, Q-LO−, so that the ultimately produced signal can move between quadrants, with the sign bit on the LO signals dictating which axis is selected.

Quadrature control words I-BB[0 . . . 15] and Q-BB[0 . . . 15] are provided to the respective switch-mode 'I' and 'Q' power cell arrays 130 of the IQ PA 100 to select a number of power cell arrays 130 to be used. In this manner, the switch-mode power cells used for the 'I' digital PA (IDPA) and the switch-mode power cells used for the 'Q' DPA are independently driven, that is: an 'I' code controls a number of transistors turning on in the IDPA and a 'Q' code controls a number of transistors turning on in the QDPA. Thereafter, the two power amplified outputs of the respective quadrature radio frequency signals are combined in radio frequency combiner 140.

In this manner, the IQ PA 100 comprises a complex IQ based transmitter architecture that extends the digital domain through to the radio frequencies, thereby benefiting from the scalability and efficiency of digital components to a greater extent than conventional (linear) PA architectures. However, the combining of the two power amplified outputs of the respective quadrature radio frequency signals produces an undesirable efficiency loss.

Thus, there is a general need for concepts to better manage and reduce efficiency loss in digital transmitters.

SUMMARY

Accordingly, the invention seeks to mitigate, alleviate or eliminate one or more of the above mentioned disadvantages, either singly or in any combination. Aspects of the invention provide a wireless communication unit, an integrated circuit and a method therefore, as described in the appended claims.

According to a first aspect of the invention, a transmitter circuit is described that comprises a frequency generation circuit configured to generate a local oscillator signal; and a digital quadrature modulator coupled to the frequency generation circuit and configured to receive data to be transmitted and quadrature modulate the received data to at least a first, Q, modulated value and a second, I, modulated value; examine the quadrature modulated data to determine if the first, Q, modulated value exceeds a limit, and in response thereto selectively modify the quadrature modulated values to a first modified, modulated value and a second modified, I', modulated value thereby bringing only a value of the first modified, Q', modulated value to within the limit; and select and apply a local oscillator phase to map the first modified, modulated value and second modified, I', modulated value to desired quadrature values.

In this manner, a transmitter using a digital PA uses a digital quadrature modulator configured to remap modulated I and Q data to new data points, to be applied to the DPA. In particular, the digital quadrature modulator remaps the data points to bring only a value of a first modified, e.g. Q', modulated value to within a limit. The reduction of the 'Q' value to within a limit before being transmitted enables, for example, fewer cells of a QDPA to be needed, which causes a smaller phase change being effected via the DPA cells. In some examples, this allows only a fine phase change to be effected using DPA cells. In some examples, the main phase change may be managed through a coarse phase change operation outside the DPA, e.g. using the PLL, or by generating, say, '8' or '16' phases (or more) of a local oscillator (LO) signal and selecting the phase that is closest to the desired output phase. In this manner, the selected LO phase plus the phase created by the IDPA+QDPA may equal the required/desired phase, whilst the combination of the IDPA and QDPA create the desired magnitude at the output. The selection of a coarse phase outside the DPA may be achieved using, for example, a multiplexer, or by using two point modulation in the phase locked loop (PLL) to perform a fixed phase rotation.

As such, one benefit of such a transmitter architecture may be to increase an operating efficiency of the transmitter. In one aspect, such a transmitter architecture may be considered as a hybrid between a polar transmitter and an IQ transmitter. For example, the inventors have appreciated that efficiency loss associated with a DPA may be alleviated by turning on portions of a QDPA without producing a proportional output power. In one example efficiency loss associated with a DPA may be alleviated by turning the DPA on with very little current consumption, by say only using a portion of the available Q power cells of the QDPA, in order to apply a limited or fine phase change only using the quadrature signals. Only a small value is applied to the QDPA due to the manipulation of the Q data to a (lower) modified Q' value that is constrained within a limit, such as a predefined limit. As a consequence, the loss of efficiency that is suffered in normal operation of a conventional quadrature digital PA may be reduced.

According to an optional example, the digital quadrature modulator may be configured to selectively modify the first, Q', modulated value to within the limit by applying a first quadrature control word to a 'Q' quadrature portion of the DPA in order to generate a first quadrature power. The first quadrature power is lower than a second quadrature power that would have been generated by amplifying the first, Q, modulated value.

According to an optional example, the digital quadrature modulator may be configured to apply the first quadrature control word to the DPA such that a reduced number of power cell arrays of the 'Q' quadrature portion of the DPA is selected, in order to produce smaller phase change with the first modified, Q', modulated value than would have been for amplifying the first (non-modified), Q, modulated value.

According to an optional example, the digital modulator may be configured to apply the limit such that the DPA applies a first amplification and phase change to generate first modified, Q', modulated value that is lower than a second amplification and phase change to generate the second modified, I', modulated value.

According to an optional example, the digital modulator may be configured to apply the limit such that the DPA applies a first amplification and phase change to generate first modified, Q', modulated value that is lower than a second amplification and phase change to generate the second modified, I', modulated value.

According to an optional example the frequency generation circuit may comprise a local oscillator, LO, and a phase locked loop, PLL, configured to generate the LO signal, wherein a coarse phase change of a PLL output provides an additional phase change to further modify the quadrature modulated values.

For example, by limiting QDPA input, it may be possible to avoid scenarios where a lot of current is consumed to define the output, whilst the actual output power increases only by a little amount. By avoiding such instances (e.g. through limiting the QDPA code and thereby reducing the number of power cell arrays to be used) it is possible to increase the efficiency of the DPA. By limiting the power expended in the Q channel to be less than a certain value (or a certain proportion of the 'I' value) a reduction in efficiency loss (i.e. an increase in transmitter/DPA efficiency) may be achieved. In a back-off mode of operation when the output power is in the linear region of the DPA, the operation becomes increasingly like normal quadrature operation.

According to an optional example, the digital modulator quadrature may be configured to modulate the received data to a first, Q, modulated value and a second, I, modulated value in a first constellation and is configured to examine the quadrature modulated data to determine if the first, Q, modulated value exceeds the limit on a first constellation axis, and in response thereto the digital modulator may be configured to selectively modify the quadrature modulated values to a first, Q', modulated value and a second modified, I', modulated value to bring only the first modified, Q', modulated value to within the limit as applied to a second constellation axis.

According to an optional example, the digital modulator may be configured to selectively modify the quadrature modulation values by rotating quadrature axes of the first constellation to form new axes of the second constellation. In some optional examples, the proposed digital quadrature rotation technique may be employed to increase efficiency at higher output powers.

According to an optional example, the digital modulator may rotate the axes using at least one from a group of: a multiplexer selection switch, a digital phase locked loop (PLL), an analog PLL supporting two-point modulation. In some examples, the KDCO of the PLL may be periodically estimated to ensure it is accurate and thereby maintain good adjacent channel leakage rejection (ACLR) and error vector magnitude (EVM) levels.

According to an optional example, the digital power amplifier, DPA, may comprise multiple quadrature DPAs, each QDPA configured to amplify respectively quadrature modified modulated data, wherein one or more first QDPA employs less current to amplify the first modified, Q', modulated value than one or more second quadrature QDPA amplifying the second modified, I', modulated value.

In some optional examples, the multiple QDPAs may output multiple modulated signals to a digital quadrature combiner and the frequency generation circuit may be coupled to a selectable multiplexer configured to provide a selectable local oscillator phase to the multiple QDPAs. The digital quadrature modulator may be configured to output a phase control signal to the frequency generation circuit, such that a LO phase selected by the phase control signal effects a fine phase control of the LO signal output from the frequency generation circuit.

In some optional examples, the digital quadrature modulator may be configured to apply a coarse phase modulation to a phase selector operably coupled to the selectable multiplexer thereby selecting the local oscillator phase to be applied to each of the multiple QDPAs.

According to an optional example, the DPA may comprise a combined DPA configured to and the frequency generation circuit is coupled to a selectable multiplexer configured to provide a selectable local oscillator signal phase by rotating through LO phases such that the desired output phase from the combined DPA implements spatial combining of at least the first modified, Q', modulated value and second modified, I', modulated value.

In some optional examples, the digital quadrature modulator is configured to output a phase control signal to the frequency generation circuit, such that the phase control signal applies a fine phase control signal to the PLL of the frequency generation circuit and a coarse phase modulation to an axis selector coupled to the selectable multiplexer thereby selecting a constellation axis to be used in generating modified quadrature data.

According to an optional example, the digital quadrature modulator may be configured to output a phase control signal to the frequency generation circuit, such that the phase control signal applies a fine phase control signal to the PLL of the frequency generation circuit and a coarse phase modulation to an axis selector coupled to the selectable multiplexer thereby selecting a constellation axis to be used in generating modified quadrature data. In some examples, the digital quadrature modulator may be coupled to a second selectable multiplexer configured to select a phase of the local oscillator signal to be applied to the combined DPA.

According to a second aspect of the invention, a communication unit comprises a transmitter circuit comprising: a frequency generation circuit configured to generate a local oscillator signal; and a digital modulator coupled to the frequency generation circuit and configured to: receive data to be transmitted; quadrature modulate the received data to at least a first, Q, modulated value and a second, I, modulated value; examine the quadrature modulated data to determine if the first, Q, modulated value exceeds a limit, and in response thereto selectively modify the quadrature modulated values to a first modified, Q', modulated value and a second modified, I', modulated value thereby bringing only a value of the first modified, Q', modulated value to within the limit. The quadrature digital modulator is configured to select a local oscillator phase to map the first modified, Q', modulated value and second modified, I', modulated value to desired quadrature values.

According to a third aspect of the invention, a method for amplifying a complex quadrature signal; comprises: receiving data to be transmitted; quadrature modulating the received data to at least a first, Q, modulated value and a second, I, modulated value; examining the quadrature modulated data to determine if the first, Q, modulated value exceeds a limit, and in response thereto selectively modifying the quadrature modulated values to a first modified, Q', modulated value and a second modified, I', modulated value thereby bringing only a value of the first modified, Q', modulated value. In some examples, the flowchart further comprises selecting a local oscillator phase to map the first modified, Q', modulated value and second modified, I', modulated value to desired quadrature values; and to within the limit; and amplifying the quadrature modified modulated data.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGs are illustrated for simplicity and clarity and have not necessarily been drawn to scale.

DETAILED DESCRIPTION

Examples of the invention will now be described with reference to a digital transmitter architecture and method. The digital transmitter circuit comprises a digital quadrature modulator configured to receive data to be transmitted and quadrature modulate the received data to at least a first, Q, modulated value and a second, I, modulated value; examine the quadrature modulated data to determine if the first, Q, modulated value exceeds a limit, and in response thereto selectively modify the quadrature modulated values to a first modified, Q', modulated value and a second modified, I', modulated value thereby bringing only a value of the first modified, Q', modulated value to within the limit and a digital power amplifier, DPA, configured to amplify the digitally modulated data. In particular examples, a digital quadrature (de-)rotation of a constellation axis, thus yielding an opposite (de-)rotation of data located in the constellation may be used to modify the quadrature value(s).

Furthermore, because the illustrated examples of the present invention may for the most part, be implemented using electronic components and circuits known to those skilled in the art, details will not be explained in any greater extent than that considered necessary as illustrated below, for the understanding and appreciation of the underlying concepts of the present invention and in order not to confuse or distract from the teachings of the present invention.

Figure 1:
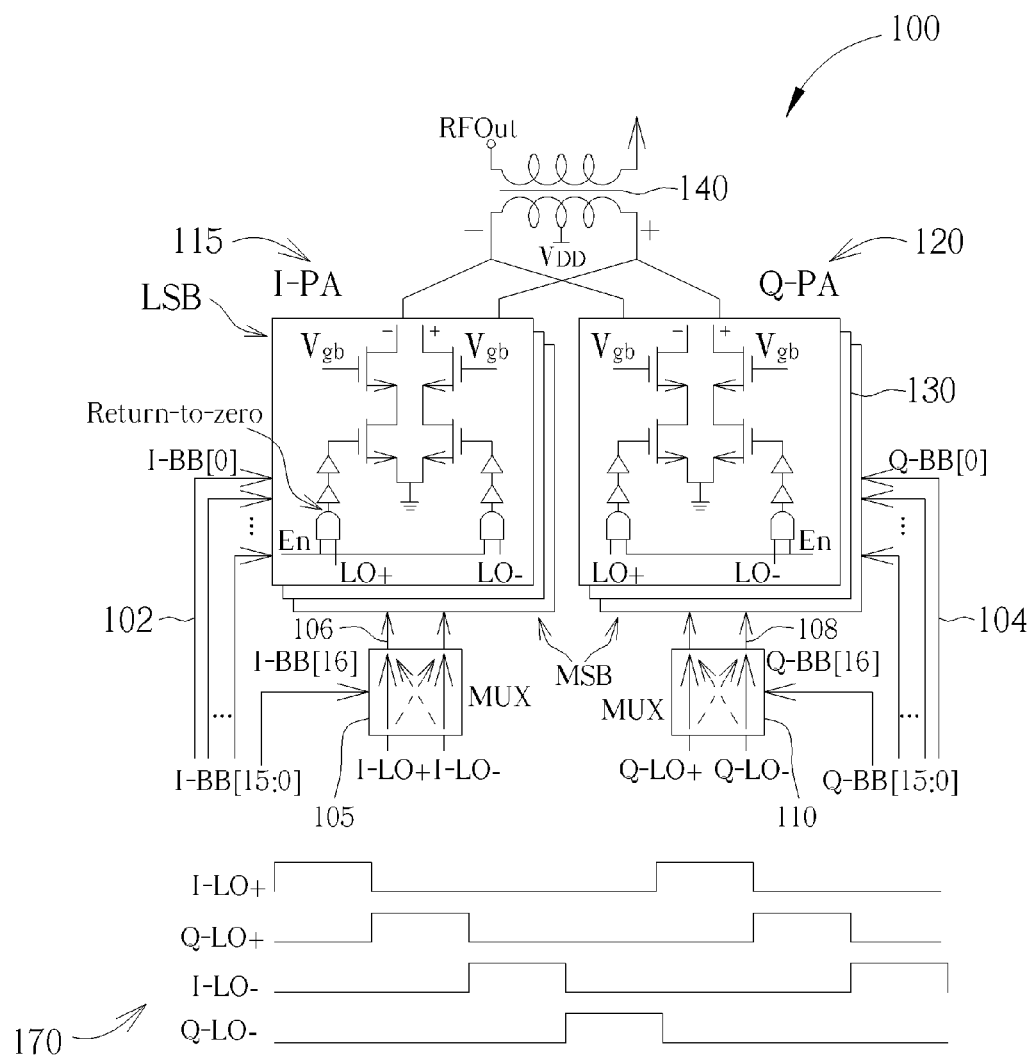
FIG. 1 illustrates a known block diagram of part of a digital quadrature (IQ) power amplifier (PA).
Figure 2:
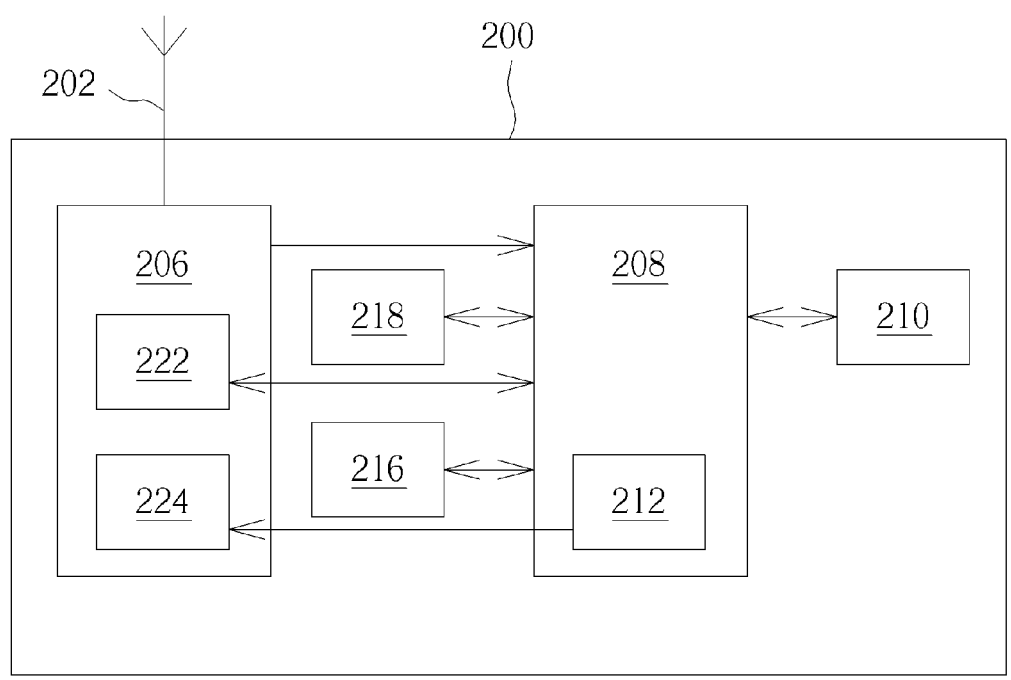
FIG. 2 illustrates an example block diagram of part of an electronic device employing a digital IQ PA according to examples of the present invention.

Referring to FIG. 2, there is illustrated an example of a simplified block diagram of part of an electronic device 200 adapted to support the inventive concepts of an example of the present invention. The electronic device 200, in the context of the illustrated example of the invention, is a wireless communication unit such as a mobile telephone handset comprising an antenna 202. The communication unit 200 contains a radio frequency and digital front end 206, operably coupled to the antenna 202 that will not be described further herein. In this example, the radio frequency and digital front end 206 comprises a frequency generation circuit 222, which in the described example comprises a PLL as will be described in greater detail below. The radio frequency and digital front end 206 further comprises a digital power amplifier (DPA) 224. In other examples, the radio frequency and digital front end 206 may be operably coupled at its output to DPA 224, for example via a digital combiner (not shown). The communication unit 202 further comprises controller 208. An output from the controller 208 is provided to a suitable user interface (UI) 210 comprising, for example, a display, keypad, microphone, speaker, etc.

For completeness, the controller 208 is operably coupled to a memory 216 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 218 is typically coupled to the controller 208 to control the timing operations within the communication unit 200.

In accordance with examples of the invention, the controller 208 comprises, inter-alia, at least one digital baseband processor adapted to co-operate with frequency generation circuit 222 and DPA 224. In some examples, the frequency generation circuit 222 comprises a Phase Locked Loop (PLL). In some examples, the at least one digital baseband processor may comprise a digital quadrature modulator adapted to modify quadrature values of data to be transmitted in accordance with the following methodologies. The digital quadrature modulator determines (or is informed, for example by accessing a look up table or memory 216) a particular phase shift to be applied by the frequency generation circuit 222 to transmit signals to be amplified by DPA 224.

In some examples, an auxiliary receiver path from the radio frequency and digital front end (e.g. via a duplexer (not shown) coupled to the antenna or combiner) may be used to feedback a portion of the transmit signal, such that the controller is able to estimate transmitter linearity impairments and consequently apply suitably adjusted predistortion settings to be applied to the input transmit signal.

Figure 3:
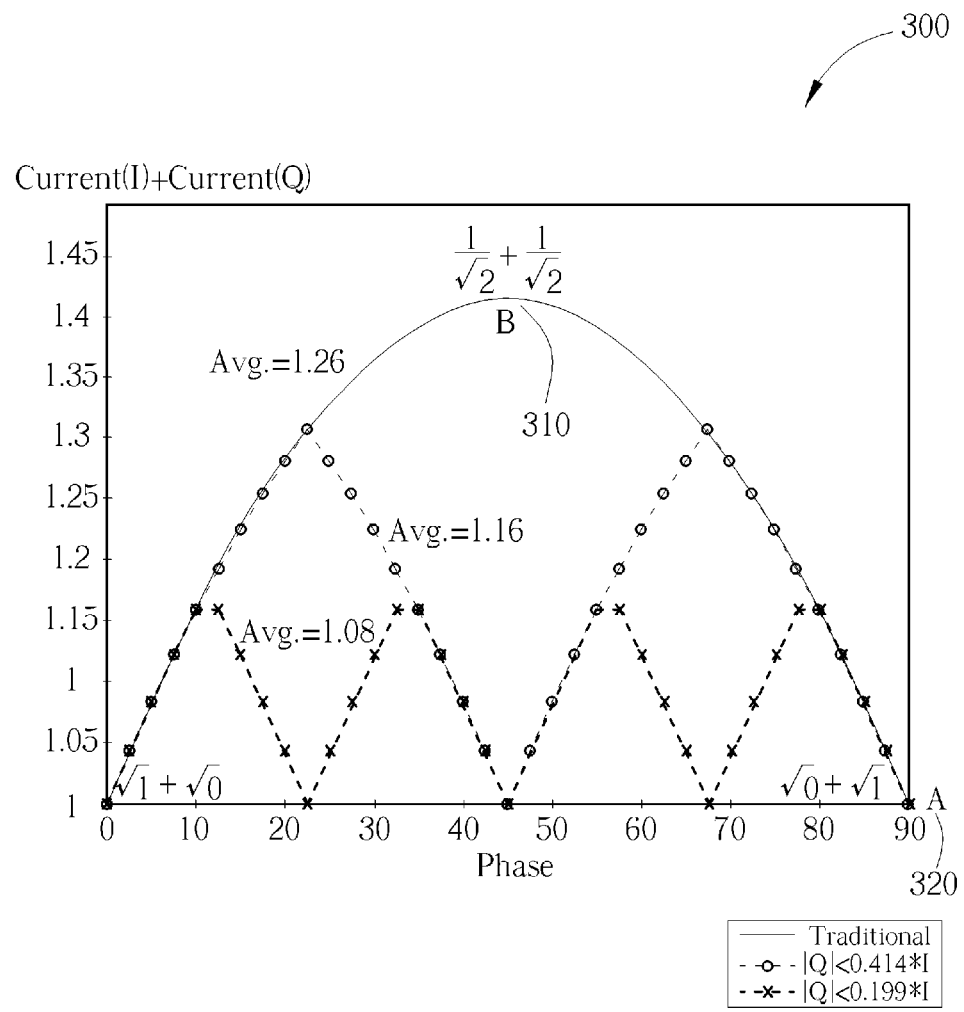
FIG. 3 illustrates a plot of average current consumption ($I_{current}+Q_{current}$) for the same output power of a digital IQ PA.

FIG. 3 illustrates a plot of average current consumption ($I_{current}+Q_{current}$) for the same output power of a digital IQ PA, i.e. $I_{current}+Q_{current}$ as a function of output phase for a digital IQ PA with a constant output power (Pout). As illustrated at point A 320, a 100% (relative) efficiency level of the digital IQ PA may be achieved. If the digital IQ PA comprises two quadrature DPAs, a QDPA and an IDPA, point A 320 expresses the case where only, say, a QDPA is turned 'on' and delivers the maximum output power that is capable of being delivered by the QDPA. However, this output power is still 3 dB below the maximum power output, as indicated at point B 310, where both IDPA and QDPA are turned 'on' and where each DPA is delivering respectively their maximum output powers, albeit in a quadrature relationship with each other.

Thus, the current consumed at point A 320 is half of the current consumed at point B 310, whilst the power delivered at point B 310 is only 3 dB higher. If however, IDPA and QDPA were placed in-phase to each other, the power delivered would be 6 dB higher, albeit that an ability to perform phase modulation by controlling magnitudes of IDPA and QDPA currents would be lost. If an efficiency gain is derived from the power output to current saving consumed by DPA, the efficiency is higher at a phase angle of '0' degrees and 90 degrees, because with half the current 3 dB lower power is delivered. At point B 310, a doubling of the consumed current only increases the output power (Pout) by 3 dB. At intermediate angles between '0' degrees and 90 degrees, the efficiency gain lies between these two values depending on the phase angle employed. If we assume that each phase is equally likely during modulation, then the average current consumed is 26% higher than the current at point A 320. Comparably, for the same output power, the average efficiency if each phase is equally likely is 26% worse than the peak efficiency at point A 320.

Therefore, examples of the invention have proposed achieving the modulation without operating the DPA in a region where the efficiency is most degraded, such that the overall efficiency of the DPA will be improved. For example, in some examples a phase angle change resulting for relative magnitude of IDPA and QDPA may be limited to less than or equal to 45 degree only (rather than 90 degree phase angle change in traditional architecture. In such an example, 16% more average current will be consumed. Likewise, in other examples, if the phase angle change is limited to less than or equal to 22.5 degree, 8% more average current will be consumed compared to operating on point A 320 only. To support such a phase-limited mode of operation, the needed phase modulation may be supported through the LO system, for example to apply coarse phase modulation whilst the DPA provides any fine phase modulation, such that the two phases add up to the required phase.

Figure 4:
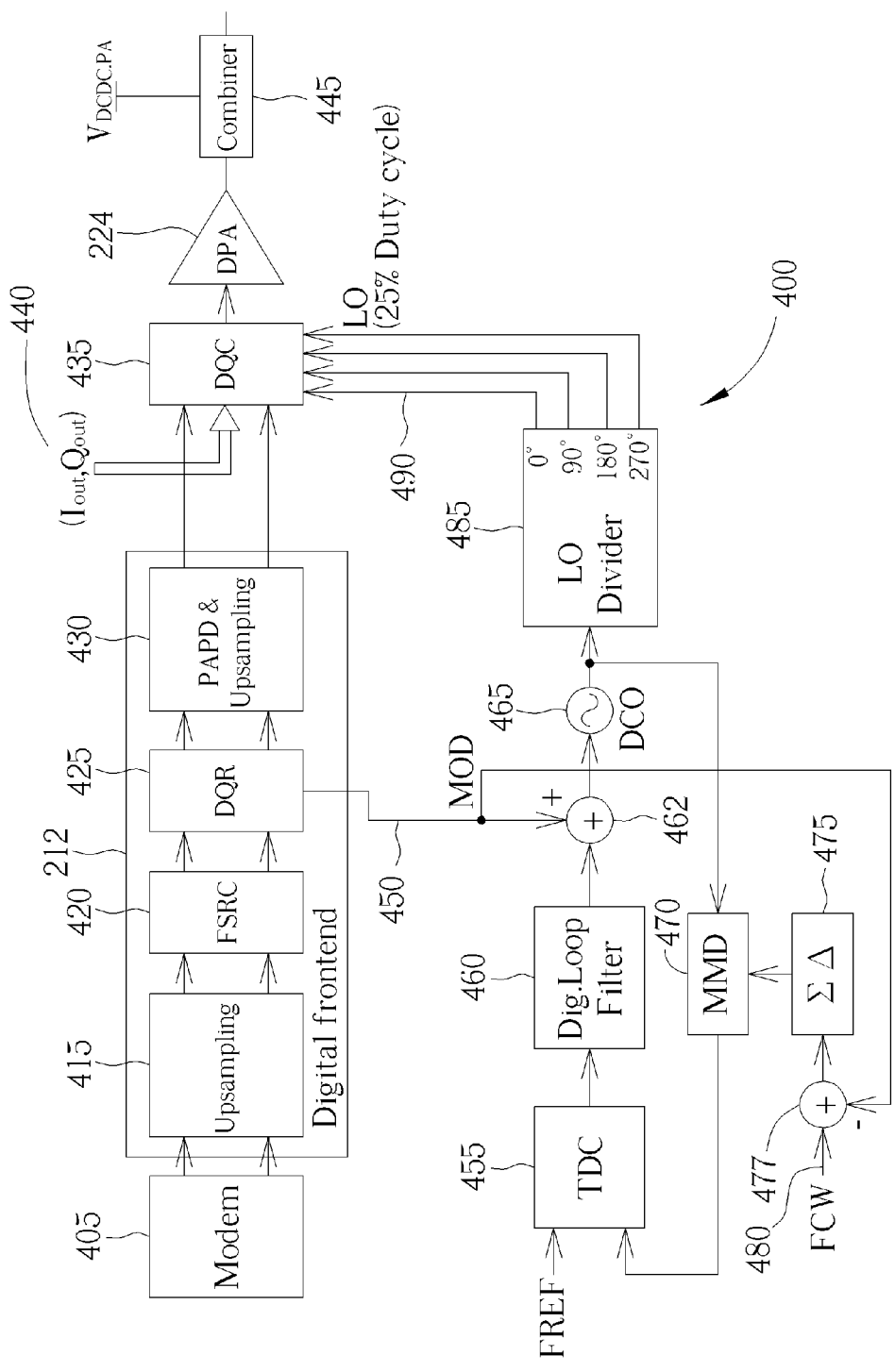
FIG. 4 illustrates a more detailed example block diagram of a transmitter chain incorporating a digital IQ PA according to examples of the present invention.

Referring now to FIG. 4, there is illustrated a more detailed example block diagram 400 of a transmitter chain incorporating a DPA 224, such as a digital IQ PA according to examples of the present invention. The example block diagram 400 comprises an input digital quadrature signal for transmission that is generated by a modem 405. The digital quadrature signal is input to a radio frequency and digital front end 206, which in this example comprises an up-sampling block, which up-samples the digital quadrature signal and inputs the up-sampled signal to a frequency sample rate conversion (FSRC) block 420. In some examples, low clock signals may be used to drive high rates in the FSRC block 420, in order to provide high data rate quadrature signals to a digital quadrature rotation (DQR) module 425.

In accordance with example embodiments of the invention, the DQR module 425 is provided to provide efficiency improvements to the DPA. In particular, the data associated with one quadrature path, namely the Q path data, is limited to a lower range of values. In one example, this lower range of Q values may be representative of DG09 operation. The DQR module 425 is configured to receive quadrature (I, Q) data, which may be considered in some examples in a constellation form, and determine whether the quadrature data points on the constellation, e.g. the Q value, has exceeded the imposed, and in some instances predetermined, limit. In some examples, therefore, the Q value limit may be considered as a particular or defined circle size, when viewed in a constellation form. In some examples, the imposed, and in some instances predetermined, limit influences the size of all signals applied to a QDPA, when the DPA comprises two distinct quadrature DPAs.

Although examples of the invention are described with reference to determining whether a Q value exceeds a limit, and modifying the value to bring the value within the limit, for example by rotating constellation axes, it is envisaged that the concepts equally apply to a different quadrature value, such as the 'I' value(s).

If the quadrature data point on the constellation, e.g. the Q value, has exceeded the applied limit, the DQR module 425 modifies the I, Q data to a new coordinate system. If rotation is needed, the DQR module 425 estimates the amount of correction (e.g. by rotation of the constellation axes) that is needed in order to bring the Q value back within its range, i.e. the constellation axes is moved towards the data point such that a smaller QDPA code is needed to bring the output power to the desired magnitude and phase. In some examples, the DQR module 425 may apply this amount of correction/rotation of the I-Q axes by a predetermined amount, e.g. 22.5 deg., thereby requiring de-rotating the I and Q data points a corresponding amount, e.g. −22.5 deg to reach the intended constellation point. In this manner, new I' and Q' data points are created. In some examples, the DQR module 425 may rotate the I-Q axes on a constellation graph using a multiplexer selection signal ('MUXSEL'), which selects the multiplexer to use in order to transition the axes or data point(s) to a particular constellation quadrant.

Advantageously, the inventors have recognised and appreciated that a reduction of the QDPA value will also reduce the current needed to output the desired constellation point, and thereby increase efficiency. The axis is rotated in this example embodiment entirely using a two point modulation in the PLL, such that it is closer to the desired constellation point. As an example, to output magnitude at point A 320 of FIG. 3 at an angle of 27 degrees, the PLL is required to rotate the axis by 22.5 degree. With a new axis, the value fed to the DPA for a signal at point A 320 is at an angle of 27−22.5=4.5 degrees. This provides the modified I', Q' values together with the new axis at 22.5 degree offset from the original constellation, needed to produce the desired value A at 27.5 degree. Thus, instead of operating QDPA at a level equal to A*sin(27.5)=0.462 A, examples of the invention only need to operate the QDPA at a level of A*sin(4.5)=0.078 A, thereby requiring a much smaller current. Noting that A*cos(27.5)=0.887 A and A*cos(4.5) =0.996 A, it can be seen that a DPA that does not employ the concepts described herein would use 0.462 A+0.887 A=1.349 A in current, as opposed to 0.078 A+0.996 A=1.074 A for a DPA that does employ the concepts described herein, i.e. this example uses 79.6% of the current that would be used without employing this example.

Although examples described herein focusing on limiting the QDPA code, it is envisaged that other examples could equally focus on limiting the IDPA code instead. Thus, within the description and claims, any specific reference to using or modifying a 'Q' value, for example in relation to a constellation axis, is only to be considered as using a first quadrature component as compared to a further quadrature component. As such, the use of 'Q' and 'I' is considered as interchangeable throughout the description and claims and is not intended to be limiting in any way to a particular quadrature component or quadrature path.

In some examples, an operational principle herein described is to have many selectable quadrature axes that can obtained by advancing the PLL by a fixed amount, such that the axis approaches one quadrature value of the desired output. In this manner, only half a DPA is turned 'on'. The remaining other half DPA is needed to produce the remaining power and the phase needed to only produce a small increment to the quadrature value such that the small increment quadrature value is sufficient to result in the desired output.

The new I' and Q' data points are output to a power amplifier pre-distortion and up-sampling block 430 that performs pre-distortion on the new quadrature (I' and Q') data. The pre-distorted new quadrature (I' and Q') data is then output to a digital quadrature combiner (DQC) 435 where the respective quadrature data signals are combined and frequency up-converted with selectable local oscillator (LO) phase signals 490. The combined output is then amplified in DPA 224. If multiple DPAs are employed, the radio frequency power amplified outputs from the multiple DPAs are combined in combiner 445 prior to transmission by an antenna (not shown).

In examples embodiments, the DPA 224 may be built entirely using an IQ style DPA, or for example as any prior art DPA that employs digital quadrature combining (DQC) to modify the I, Q data stream, for example in the element 435, to a serial stream I(n), Q(n), −I(n), −Q(n), I(n+1), Q(n+1), −I(n+1), −Q(n+1), . . . data following the DPA. In such an example, the up-conversion process in a mixer is taken into account in converting a baseband signal to an RF signal by mixing it up with 'I' and 'Q' RF LO signals that replicate the baseband output at an RF rate in the aforementioned sequence. For example, this approach can be easily verified with a 25% duty cycle quadrature LO system in which the LOI+ places I baseband data at the mixer output, followed by LOQ+ placing Q baseband data at the mixer output. It is then followed by LOI− placing −I baseband data at the mixer output and finally the LOQ− placing −Q baseband data at the mixer output. In this operation, the output is sampled at four times the LO rate whilst the baseband I and Q data are operating at a lower rate, or in the case of analog mixer, such data is represented as analog signals at mixer input.

If the quadrature data point on the constellation, e.g. the Q value, has not exceeded the imposed limit, the DQR module 425 does not modify the 'I', 'Q' data to a new coordinate system. In this situation, the digital transmitter reverts to a normal ('I', 'Q') operation with low value 'Q' data point(s).

In an enhanced example, a phase locked loop (PLL) circuit may be used and modified to help perform coarse modulation on the new I' and Q' data points. For example, the DQR module 425 may be configured to perform a residual rotate operation using the DPA 224, which in some examples may be an IDPA and QDPA, while the coarse rotation is performed by the PLL by sending a command, e.g. via control word 450, to the PLL with the angle of rotation sought. In this manner, the angle made by both the modified I', Q' values as well as the rotation introduced by the PLL, add up to desired angle of the output signal. When the constellation point is within limits, no rotation is needed and the entire output value may be determined in the traditional way with I and Q DPA values.

Outside the circle, the constellation does not move rapidly, therefore, the PLL can effect coarse fixed steps in order to rotate the axes to chase the moving constellation point whilst the modified IDPA and QDPA values provide the residual phase. In some examples, this PLL command may be time-aligned to the input ($I_{out}$, $Q_{out}$) 440 to the DQC 435. In this enhanced PLL example, a time-to-digital converter (TDC) 455 receives a frequency reference signal together with the PLL's fed back signal, which is routed via a multi-modulus divider (MMD) 470 in this illustrated example. The TDC 455 provides a loop gain where the transmit frequency is the inverse of the reference frequency $F_{ref}$ 404 (typically 26 MHz or 38.4 MHz for cellular transceivers) for the PLL. The output from TDC 455 is input to a digital loop filter and the filtered output is then summed, in summing junction 462 in this example, with a phase shift indication from DQR module 425. The resultant summed signal is input to the digitally controlled oscillator (DCO) 465 to produce a local oscillator (LO) signal output. The LO output is input to an LO divider 485 in order to produce respective LO phase signals 490 (with a 25% duty cycle) to move the new I' and Q' data points to respective quadrants in a constellation diagram. The LO output is also fed back to the MMD 470 as part of the PLL. The phase shift indication from DQR module 425 is also summed, in summing junction 477, with a frequency control word 480 and input to a sigma-delta modulator 475 that dictates the operation of the MMD 470. The rapid advance in the PLL phase is performed by feeding a control word at 450 that advances the value at the output of summing junction 462 and applies a compensating value to sigma-delta modulator 475 so that the PLL does not see these rapid changes of axes and, therefore, the loop filter does not respond.

Figure 5:
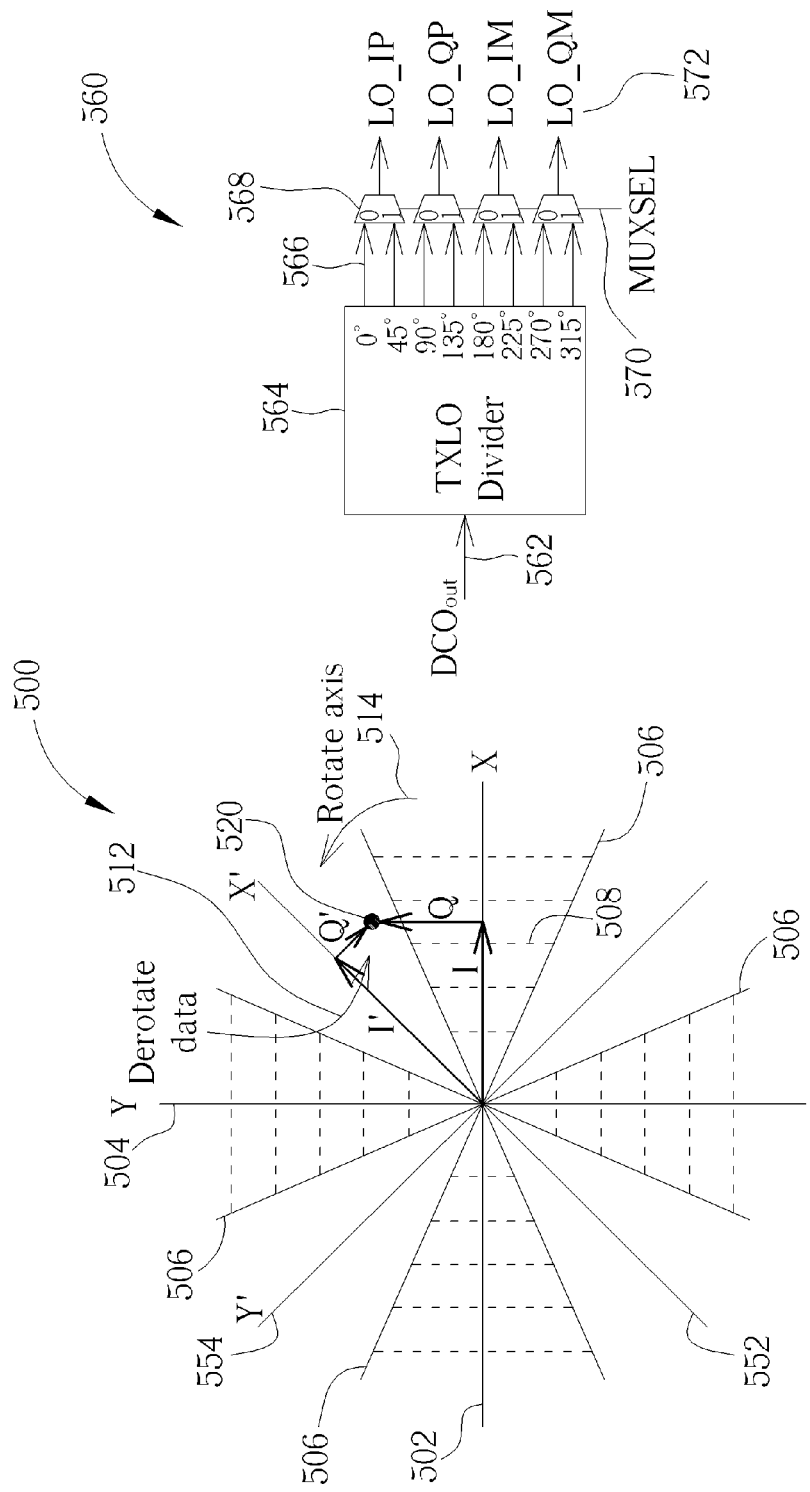
FIG. 5 illustrates a graph of the quadrature rotation of axis and effective quadrature de-rotation of data of a digital IQ PA and associated local oscillator signal generation according to a first example of the present invention.

Referring now to FIG. 5, a constellation graph 500 illustrates the quadrature rotation of axis and thereby effective quadrature de-rotation of data of a digital IQ PA according to a first example of the present invention. The constellation graph 500 illustrates an X axis 502 and a Y axis 504 with regions 506 that set a series of optional limits for one quadrature value, such as the Q value.

As illustrated, a data point 520 is located outside of the limit. In response thereto, a rotation of 45 deg. of the X axis 502 and Y axis 504 to X' axis 552 and Y' axis 554 is performed, for example by DQR module 425 of FIG. 4. Such a rotation of the X axis 502 and Y axis 504 to X' axis 552 and Y' axis 554 effectively represents a de-rotation 512 of the data by a corresponding rotational amount, thereby resulting in the quadrature value, such as the Q value, being moved back within the limits of the X' axis in this example. The DQR module 425 of FIG. 4 calculates the de-rotated output I', Q' and the angle by which the axes are rotated, and this is fed to the PLL via control word 450. In this example, the PLL supports two-point modulation and, therefore, it is able to rotate the axes by the desired angle.

FIG. 5 also illustrates one example configuration 560 of local oscillator signal generation associated with constellation graph 500. Here, transmit local oscillator (LO) divider 564 receives a LO signal 562 from, say, a DCO, and outputs a series 566 of phase shifted versions of the LO signal 562. In this example, an axis shift of 45 deg. is supported, and therefore eight optional phase shifts (0 deg. to 315 deg.) are output. These eight optional phase shifts are input to a series of four multiplexers 568 that are configured to receive two LO inputs each (separated by 45 deg.) and output a selected phase-shifted LO signal 572 if selected by a multiplexer selection control signal (MUXSEL) 570. In this manner, a phase-shift can be introduced to effectively de-rotate the data, for example in DQC 435 of FIG. 4 following the DQR module 425 having rotated the axes 502, 504 to 552, 554.

In one example, the DQR module 425 of FIG. 4 may select a particular QDPA size and/or set a limit 508 to be applied to a quadrature value, such as the Q value. For example, the limit 508 may be related to a particular modulation standard that is being supported. In one example, the limit 508 may be considered as equivalent to a defined circle (sometimes herein after referred to as 'S'). In the illustrated example, following data point 520 being determined as located outside of the limit 508, the DQR module 425 changes I, Q data point 520 to a new coordinate system. For example, if rotation of the axes on the constellation graph 500 is needed, the DQR module 425 estimates an amount of rotation needed. The DQR module 425 then rotates the axes using, for example, the MUXSEL signal 570, e.g. MUXSEL=0 selects axes-A 502, 504 and MUXSEL=1 selects axes-B (552, 554. The DQR module 425 may then effect any residual rotation that may be required, say using a PLL, by sending a command to PLL. In some examples, the PLL command is time aligned to ($I_{out}$, $Q_{out}$).

In this manner, a method of improving efficiency of a digital quadrature PA (Digital I/Q, Digital quadrature modulator or DQC) is shown. In effect, in one example, the DQR module 425 of FIG. 4 is configured to split (I, Q) data to ($I_{new}$, $Q_{new}$) where $Q_{new}$ is constrained to be less than a predefined threshold for the particular modulation standard being supported. The new data points ($I_{new}$, $Q_{new}$) are then applied to the DPA. The output from the DPA may be correctly generated by optionally providing the remaining phase modulation (PM) using, for example, the PLL and multiplexer input of FIG. 4 that provides a corresponding 45 degree phase rotation.

In example embodiments that do not employ a PLL, it is envisaged that the entire PM operation may be provided by the multiplexer selection (MUXSEL) only.

In some examples, DQR module 425 of FIG. 4 may be configured to partition the phase rotation between PLL and MUX accordingly in any proportion.

Figure 6:
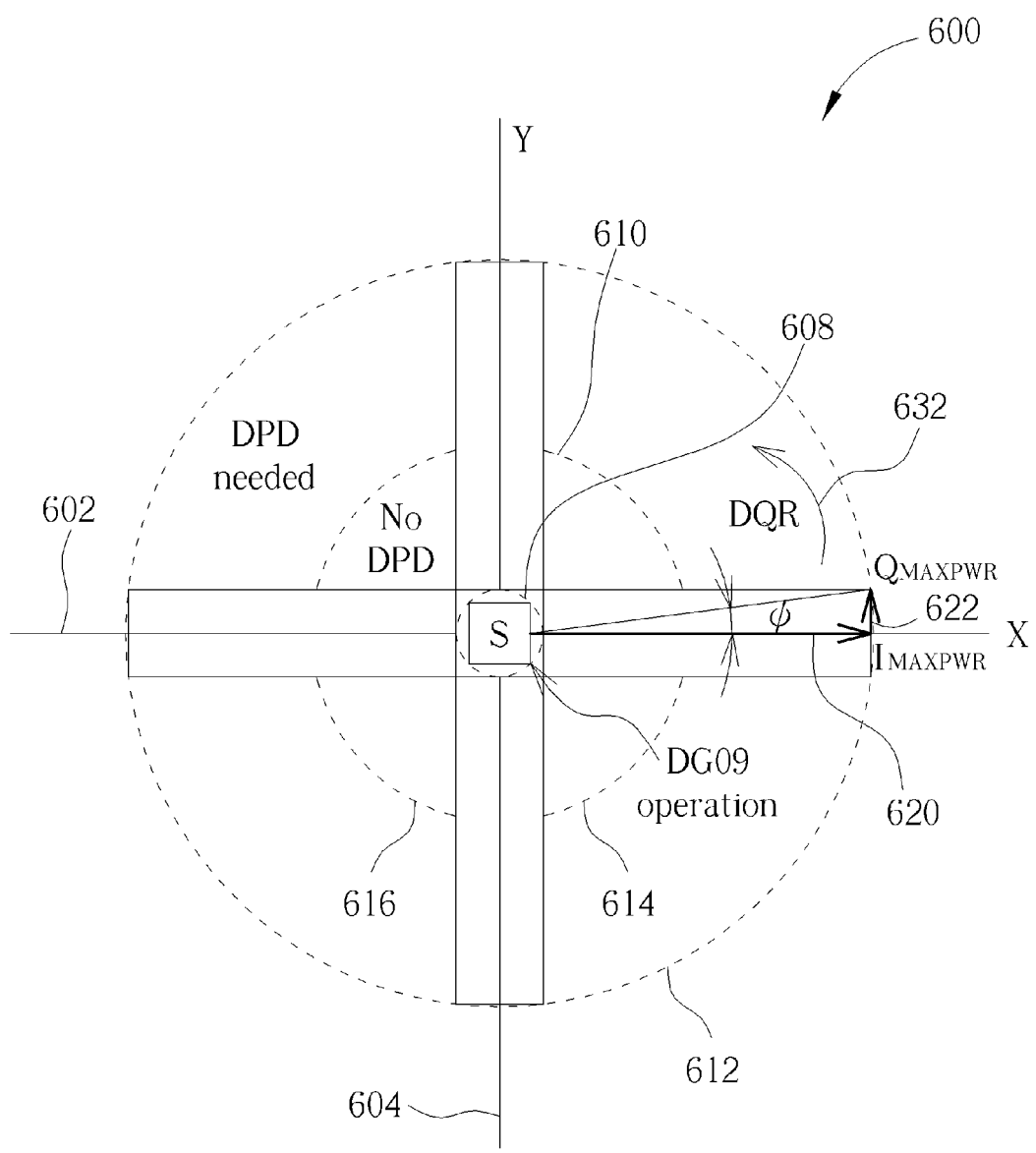
FIG. 6 illustrates an example graphical representation showing conditions when digital predistortion and/or digital quadrature rotation are employed according to examples of the present invention.

Referring now to FIG. 6, there is illustrated an example graphical representation 600 illustrating conditions when digital predistortion and/or digital quadrature rotation may be employed, according to examples of the present invention. The example graphical representation 600 illustrates an X axis 602 and a Y axis 604. In this example, a limit 608 for one quadrature value, such as the 'Q' value, has been set to be no more than a predefined threshold for a particular modulation standard being supported, which in this example is supporting a DG09 mode of operation. As shown, any 'Q' value 622 that falls outside of the dimensions of the circle 'S' will require a rotation 632 of the axes to bring the 'Q' value back into range, i.e. within the limit 608 of a new axes. As illustrated, there is no such limit applied to the other quadrature value, namely the 'I' value 620.

Thus, inside the circle 'S', which defines the extent of an allowable quadrature value, such as the 'Q' value, the transmitter operates in a normal mode, e.g. an IDPA receives an 'I' code of the data, a QDPA receives a 'Q' code, the PLL holds the unmodified LO value, and no digital predistortion (DPD) is necessary. When the quadrature 'Q' data point is located outside of the circle 'S', the DQR module 425 of FIG. 4 is configured to limit 'Q', by rotating the axis, for example using PLL, so that the 'Q' value is brought to within the selected limit 608. As illustrated, within the region 608-610, no DPD is needed or used by the transmitter. As illustrated, within the region 610-612, where larger power values of quadrature data are located, DPD is needed and used by the transmitter.

Figure 7:
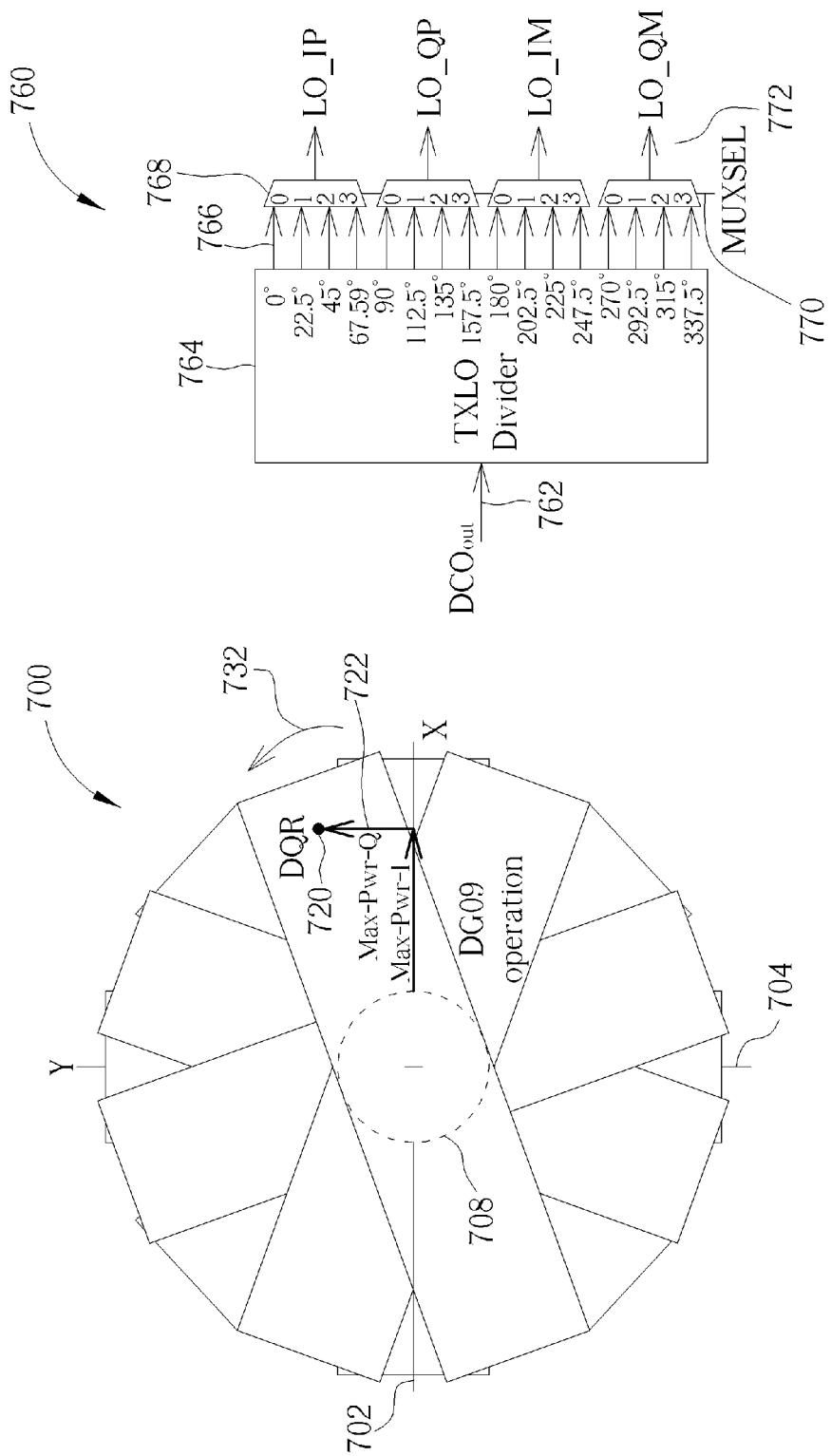
FIG. 7 illustrates a graph of the quadrature rotation of multiple axis and effective quadrature de-rotation of data of a digital IQ PA and associated local oscillator signal generation according to a second example of the present invention.

Referring to FIG. 7, there is illustrated a constellation graph 700 of the quadrature rotation of multiple axis and effective quadrature de-rotation of data of a digital IQ PA according to a second example of the present invention. The constellation graph 700 illustrates the quadrature rotation of axis and thereby effective quadrature de-rotation of data of a digital IQ PA according to a second example of the present invention. The constellation graph 700 illustrates an X axis 702 and a Y axis 704 with a limit 708 set for one quadrature value, such as the Q value. Thus, FIG. 7 illustrates that the quadrant based rotation of 45 deg. of FIG. 5 can be extended to any number of axes' positions, with rotations of 22.5 deg. illustrated here as one example.

FIG. 7 also illustrates a second example configuration 760 of local oscillator signal generation associated with constellation graph 700. Here, a transmit local oscillator (LO) divider 764 receives a LO signal 762 from, say, a DCO, and outputs a series 766 of phase shifted versions of the LO signal 762. In this example, an axis shift of 22.5 deg. is supported, and therefore sixteen optional phase shifts (0 deg. to 337.5 deg.) are output. These sixteen optional phase shifts are input to a series of four (quadrature) multiplexers 768 that are configured to receive four LO inputs each (separated by 22.5 deg.) and output a selected phase-shifted LO signal 772 if selected by a multiplexer selection control signal (MUXSEL) 770. In this manner, a phase-shift can be introduced to effectively de-rotate the data, for example in DQC 435 of FIG. 4 following the DQR module 425 having rotated the axes 702, 704.

In one example, the DQR module 425 of FIG. 4 may select a particular QDPA size and/or set a limit 708 to be applied to a quadrature value, such as the Q value. For example, the limit 708 may be related to a particular modulation standard that is being supported, such as DG09 in this example. In some examples, the limit 708 may be set to support low-power mode of operation in a particular modulation standard, whereby the PA driver may be used but not the high-power PA itself. In this manner, the transmitter operates in a normal efficient mode when the limit is set accordingly and only the PA driver is used, and switches to using the example embodiment (s) of the invention for the higher power transmissions, where the PA and PA driver are used to transmit the 'I' data, but digital quadrature rotation is applied to limit the power used to transmit the 'Q' data. Thus, the QDPA is not turned on, and the use of fewer high-power devices enables an efficiency saving and/or reduction in efficiency loss.

In one example, the limit 708 may be considered as equivalent to a defined circle 'S'. In the illustrated example, following data point 720 being determined as located outside of the limit 708, the DQR module 425 changes I, Q data point 720 to a new coordinate system. For example, if rotation of the axes on the constellation graph 700 is needed, the DQR module 425 estimates an amount of rotation needed. The DQR module 425 then rotates the axes using, for example, the MUXSEL signal 770, e.g. MUXSEL=0 selects axes-A 702, 704; MUXSEL=1 selects axes-B (22.5 deg. from axes-A 702, 704); MUXSEL=2 selects axes-C (45 deg. from axes-A 702, 704) and MUXSEL=3 selects axes-D (67.5 deg. from axes-A 702, 704). The DQR module 425 may then effect any residual rotation that may be required, say using a PLL, by sending a command to PLL. In some examples, the PLL command is time aligned to ($I_{out}$, $Q_{out}$).

In this manner, a method of improving efficiency of a digital quadrature PA (Digital I/Q, Digital quadrature modulator or DQC) is shown. In effect, in one example, the DQR module 425 of FIG. 4 is configured to split (I, Q) data to ($I_{new}$, $Q_{new}$) where $Q_{new}$ is constrained to be less than a predefined threshold for the particular modulation standard being supported. DQR module 425 then determines the closest axis and switch to the correct axes using MUXSEL signal 770. The new data points ($I_{new}$, $Q_{new}$) are then applied to the DPA. The output from the DPA may be correctly generated by optionally providing the remaining phase modulation (PM) using, for example, the PLL and multiplexer input of FIG. 4 that provides a corresponding 45 degree phase rotation.

Although examples of the invention are described with reference to movement of the constellation axes 22.5 deg. steps, it is envisaged that any other incremental or decremental step may be used to move the constellation axes and thereby move at least one of the modulation data points to be transmitted closer to a constellation axis. The axis closest to the selected point may be such that either QDPA value is limited or IDPA value is limited.

In other examples, in contrast to employing two-point modulation, it is envisaged that single point modulation may be used, whereby the frequency input may be applied elsewhere in the loop. In this case, the loop filter will attenuate the input and, therefore, the frequency input should be pre-emphasised by the inverse of the shaping filter response.

Figure 8:
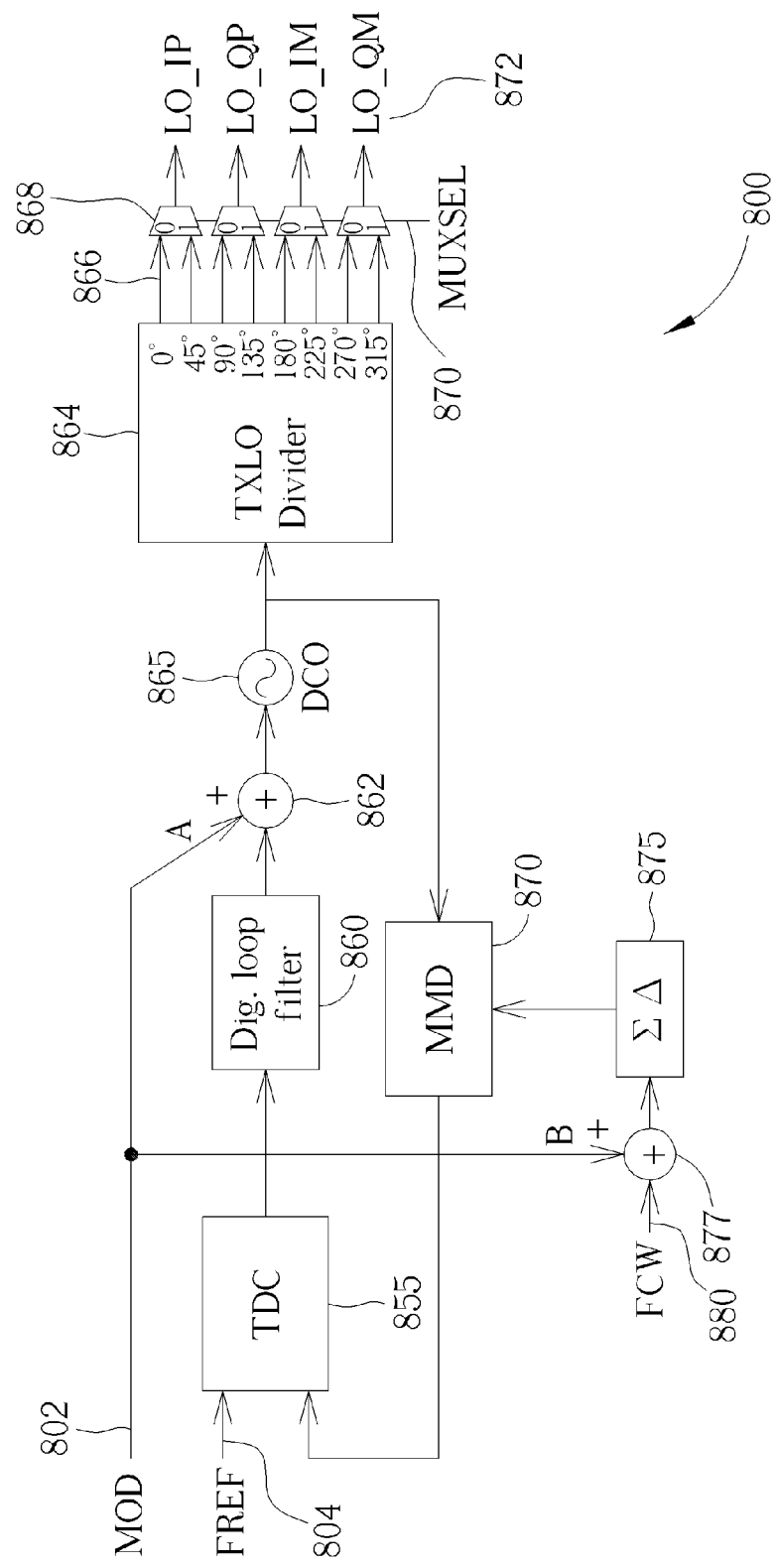
FIG. 8 illustrates an example block diagram of a phase locked loop coupled to a transmitter chain incorporating a digital IQ PA according to examples of the present invention.

Referring now to FIG. 8, an example block diagram 800 of a phase locked loop coupled to a transmitter chain incorporating a digital IQ PA according to examples of the present invention. In this example, a phase locked loop (PLL) circuit may be used and modified to help perform residual modulation on the new I' and Q' data points. For example, the DQR module 425 of FIG. 4 may be configured to perform a residual rotate operation using the PLL by sending a command to the PLL with an estimate of the new quadrature data ($I_{DQR}$, $Q_{DQR}$) that has been applied. In some examples, this PLL command may be time aligned to the input ($I_{out}$, $Q_{out}$) 440 to the DQC 435.

In this PLL example, a time-to-digital converter (TDC) 855 receives a frequency reference signal 804 and the PLL's fed back signal, which is routed via a multi-modulus divider (MMD) 870 in this illustrated example. The TDC 855 provides a gain to the difference of transmit frequency divided by the integer and fractional part selected in multi-modulus divider and the reference frequency, Fref 804 (typically 26 MHz or 38.4 MHz for cellular transceivers), for the PLL. The TDC output is input to a digital loop filter 860 and the filtered output is then summed, in summing junction 862 in this example, with a 2-point modulation signal 802. In examples of the invention, the 2-point modulation signal 802 is configured such that the AM and PM paths are time aligned and that the DCO gain ($K_{DCO}$) is accurate enough at point A. In some examples, the DCO gain ($K_{DCO}$) of the PLL may be periodically estimated to ensure it is accurate and thereby maintain good adjacent channel leakage rejection (ACLR) and error vector magnitude (EVM) levels.

The resultant summed signal is input to the digitally controlled oscillator (DCO) 865 to produce a local oscillator (LO) signal output. The LO output is input to an LO divider 864 in order to produce respective LO phase signals 872 (with a 25% duty cycle in this example). In one example, the LO divider 864 produces divided LO signals 866 with eight 45 deg. separated phases to a series of selectable multiplexers 868, which are selectable by, say DQR module 425 of FIG. 4 dependent on whether DQR module 425 wishes to move the new I' and Q' data points to respective quadrants in a constellation diagram. The LO output is also fed back to the MMD 870 as part of the PLL. The 2-point modulation signal 802 is also summed, in summing junction 877, with a frequency control word 880 and input to a sigma-delta modulator 875 that dictates the operation of the MMD 870.

In another PLL example, the two approaches can also be combined, inasmuch as the MUXSEL signal is configured to effect a coarse rotation of the axes and the PLL is configured to perform a fine-tuning of the axes rotation. In this example embodiment, the QDPA may select the residual Q value. In this case, I, Q data points are obtained by, say DQR 425 of FIG. 4 selecting the closest axis to use, via control of MMD 870. Any remainder of fine tuning of the data points that is required may be obtained by additionally applying a phase rotation by the PLL, which in this example is to a limit of 22.5 degrees. Together, this provides an 8-axis system in which it is possible to rotate the axes in 22.5 degree increments or decrements to select values for I', Q' in the co-ordinate system. For example, if the I, Q data point is at (A, 0) and the next data point is: A*cos(24), A*sin(24), this can be output as A*cos(1.5), A*sin(1.5) by selecting the PLL to rotate the axes by 22.5 degrees. If the subsequent data point is A*cos(24+67.5+1), A*sin(24+67.5+1), the axes can be further rotated by 45 degrees, through control of MMD 870 and control of the PLL by 22.5 degree. The remaining values for I', Q' will be A*cos(1), A*sin(1). Therefore, the phase selection applied may be via coarse, medium and/or fine selections. Coarse phase selection may be via control of MMD 870, which rotates the axes by 45 degree in this example. A medium phase selection may be performed by the PLL, which can limit the rotation to 22.5 degrees in this example. Any remaining rotation for a fine selection may be effected is through selection of I', Q' values in a coordinate system with a 22.5 degree phase rotation.

Figure 9:
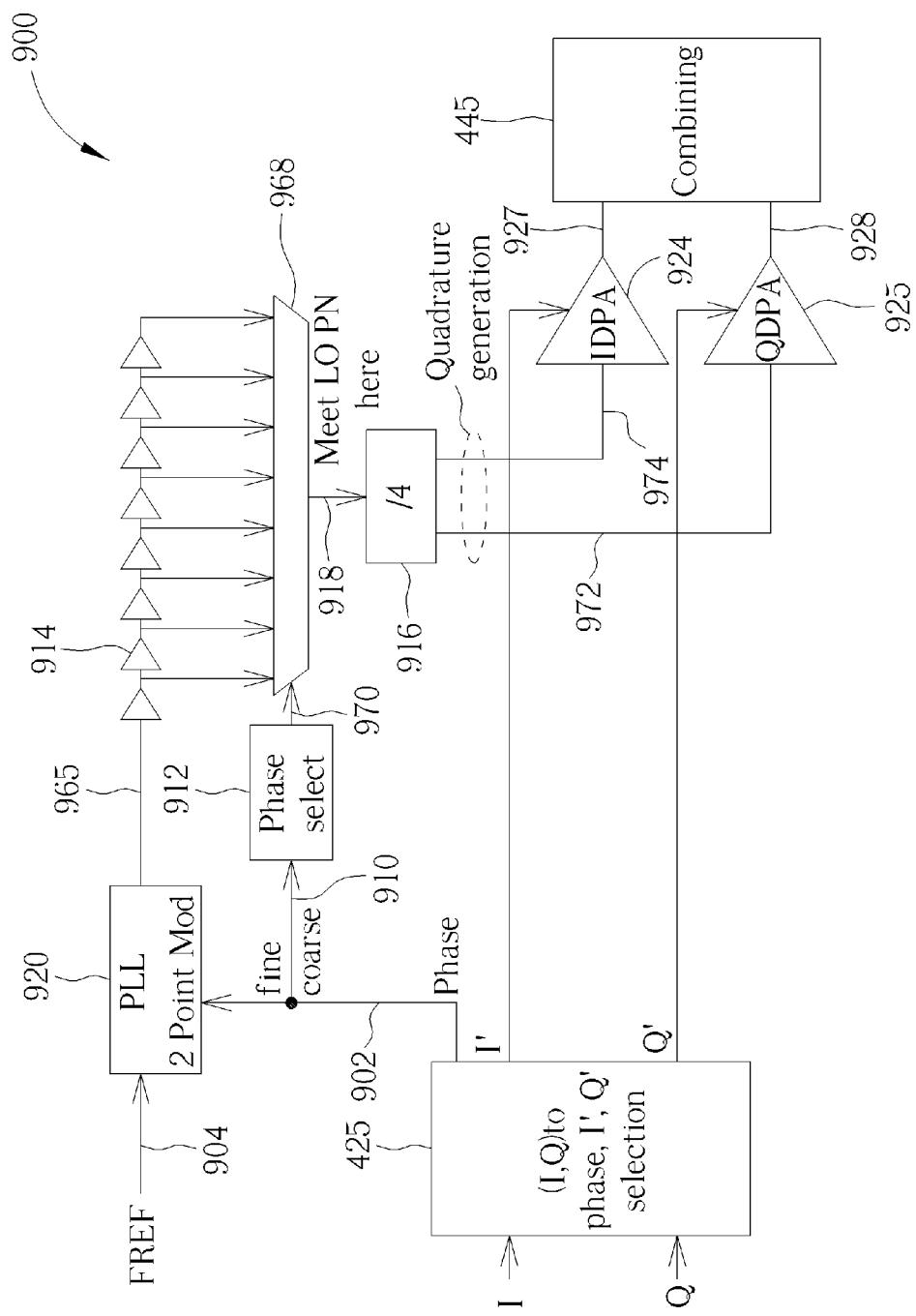
FIG. 9 illustrates a first example block diagram of a quadrature generation arrangement of a digital IQ PA according to an example of the present invention.

FIG. 9 illustrates a first example block diagram of a quadrature generation arrangement 900 of a digital IQ PA according to an example of the present invention. The quadrature generation arrangement comprises a frequency input 904 to a PLL 920, such as PLL 800 from FIG. 8. A DQR module 425 generates 'I' and outputs and provides them to a digital IQ PA, which in this example comprises distinct IDPA 924 and QDPA 925. In this example, the PLL 920 provides a LO output signal 965, which input to a series of (eight in this example) delay buffers 914 that are configured to respectively produce the LO output signals 965. The (eight) 45 deg. separated phases are respectively input to a selectable multiplexer 968, which is selectable by, say DQR module 425. If DQR module 425 wishes to move to the new I' and Q' data points in a constellation diagram, the DQR module 425 provides a residual rotate operation using the PLL 920 by sending a command 902 to the PLL 920 with an estimate of the new quadrature data ($I_{DQR}$, $Q_{DQR}$) that has been applied. In this example of the invention, the command 902 may comprise a 2-point modulation signal that is configured such that the AM and PM paths are time aligned and that the DCO gain ($K_{DCO}$) in the PLL 920 remains accurate enough. In this example, the selectable multiplexer 968 is used by the DQR module 425 to provide a coarse rotation, which in this example is used to select a rotation of between 1-8 phases of the LO output signals 965. In one example, the DQR module 425 provides a coarse phase select signal 910 to a phase selector 912 that is coupled to selectable multiplexer 968. The phase selector 912 is then able to select a particular phase of the LO output signal 965 to output to the DPA using a multiplexer control signal 970. The selectable multiplexer 968 then outputs an LO signal 918 that is a selected phase of the LO output signal 965, which is input to a divide-by-4 module 916 to generate a quadrature LO signal 968 with the IQ constellation rotated by the selected number of 45 deg. phases.

In this example, the quadrature LO signal 968 is applied, together with the I' and Q' outputs from DQR module 425, to a digital IQ PA, which in this example comprises distinct IDPA 924 and QDPA 925. The IDPA 924 and QDPA 925 output high-power quadrature radio frequency signals 927, 928 to a combiner 445 configured to combine the high-power quadrature radio frequency signals 927, 928 for transmission.

In some examples, a calibration routine may be used to compute the rotation angle of axis for each of the series of (eight in this example) delay buffers 914.

In some examples, a first output 974 from multiplexer 968 and divider 916 can feed the selected LO to the IDPA 924, whereas a second output 972 from multiplexer 968 and divider 916 can feed the selected LO to QDPA. In some examples, the multiplexer 968 and divider 916 may be replaced by two distinct multiplexers and dividers. In such an example, independent phase selection of the LO to the two DPAs is supported, even though there may not be a quadrature relationship between each signal. In some examples, the constellation point may be maintained at the desired location, therefore the mapping I', Q' from I, Q may relate to rotation of the axes location, whereby original I, Q data is mapped to I', Q' in the new axes system.

Figure 10:
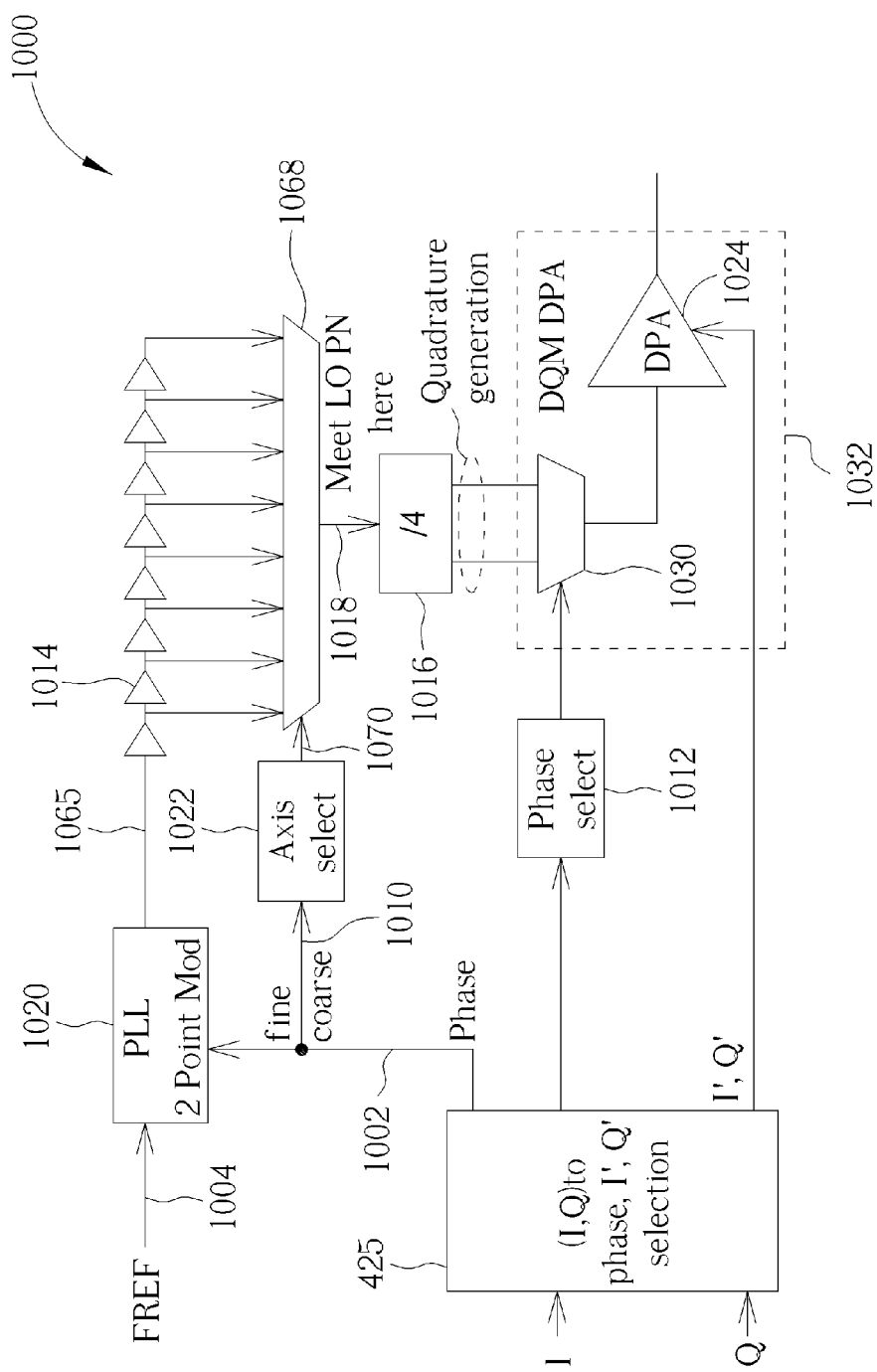
FIG. 10 illustrates a second example block diagram of a quadrature generation arrangement of a digital IQ PA according to an example of the present invention.

FIG. 10 illustrates a second example block diagram of a quadrature generation arrangement 1000 of a digital IQ PA according to an example of the present invention. The quadrature generation arrangement comprises a frequency input 1004 to a PLL 1020, such as PLL 800 from FIG. 8. A DQR module 425 generates 'I' and 'Q' outputs and provides them to a digital IQ PA, which in this example comprises a combined quadrature DPA 1024. In this example, the PLL 1020 provides a LO output signal 1065, which input to a series of (eight in this example) delay buffers 1014 that are configured to respectively produce the LO output signals 1065. The (eight) 45 deg. separated phases are respectively input to a selectable multiplexer 1068, which is selectable by, say DQR module 425. If DQR module 425 wishes to move to the new I' and Q' data points in a constellation diagram, the DQR module 425 provides a residual rotate operation using the PLL 1020 by sending a command 1002 to the PLL 1020 with an estimate of the new quadrature data ($I_{DQR}$, $Q_{DQR}$) that has been applied. In this example of the invention, the command 1002 may comprise a 2-point modulation signal that is configured such that the AM and PM paths are time aligned and that the DCO gain ($K_{DCO}$) in the PLL 1020 remains accurate enough. In this example, the PLL 1020 performs a coarse rotation. Additionally, a 2-point modulation may be used if the PLL 1020 is needed to move quickly. In this example, the QDPA portion of the DPA 1024 is configured to select the fine residual value. The DPA 1024 in this example time interleaves I', Q' data at four times the local oscillator (LO) frequency. Therefore, the output is configured by a single DPA in the sequence I'(n), Q'(n), −I'(n), −Q'(n), I'(n+1), Q'(n+1), −I'(n+1), −Q'(n+1), . . . and so on. One feature of the architecture of FIG. 10 is the limiting of quadrature (Q) values using the axes rotation, such that a limited number of cells are turned on during the Q-LO time, thereby improving the system efficiency. Examples of this invention are applicable to most or all forms of digital PA (RFDACs) in regard to the principle of limiting the number of cells that may be turned on during the time when the quadrature data is applied to the PA, irrespective of the angle selected, in order to represent the quadrature component. In some cases, axes that are not separated by 90 degree can comprise the I/Q axes.

It can be easily conceived that any axes configuration can be rotated to force a minimum number of cells to be turned on in order to produce the desired output with the LO generation used to bring the axes or (one axis) as close as possible within power dissipation and implementation constraints to the desired constellation point.

In this example, the selectable multiplexer 1068 is used by the DQR module 425 to provide a coarse rotation, which in this example is used to select a rotation of between 1-8 phases of the LO output signals 1065. In one example, the DQR module 425 provides a coarse axis select signal 1010 to an axis selector 1022 that is coupled to selectable multiplexer 1068. The axis selector 1022 is then able to select a particular constellation axis to transition the IQ data values to. The axis selector 1022 output signal 1070 is input to selectable multiplexer 1068. The selectable multiplexer 1068 then outputs an LO signal 1018 that is a selected phase of the LO output signal 1065, which is input to a divide-by-4 module 1016 to generate a quadrature LO signal 1068 with the IQ constellation rotated by the selected number of 45 deg. phases.

In this example, the quadrature LO signal 1068 is applied, together with the I' and Q' outputs from DQR module 425, to a digital IQ PA, which in this example comprises DPA, comprises a combined DPA 1024 configured to implement spatial combining of at least the first modified, Q', modulated value and a second modified, I', modulated value. The DPA 1024 outputs high-power quadrature radio frequency signals. No combiner is needed in this example embodiment.

In some examples, a calibration routine may be used to compute the rotation angle of axis for each of the series of (eight in this example) delay buffers 1014.

Figure 11:
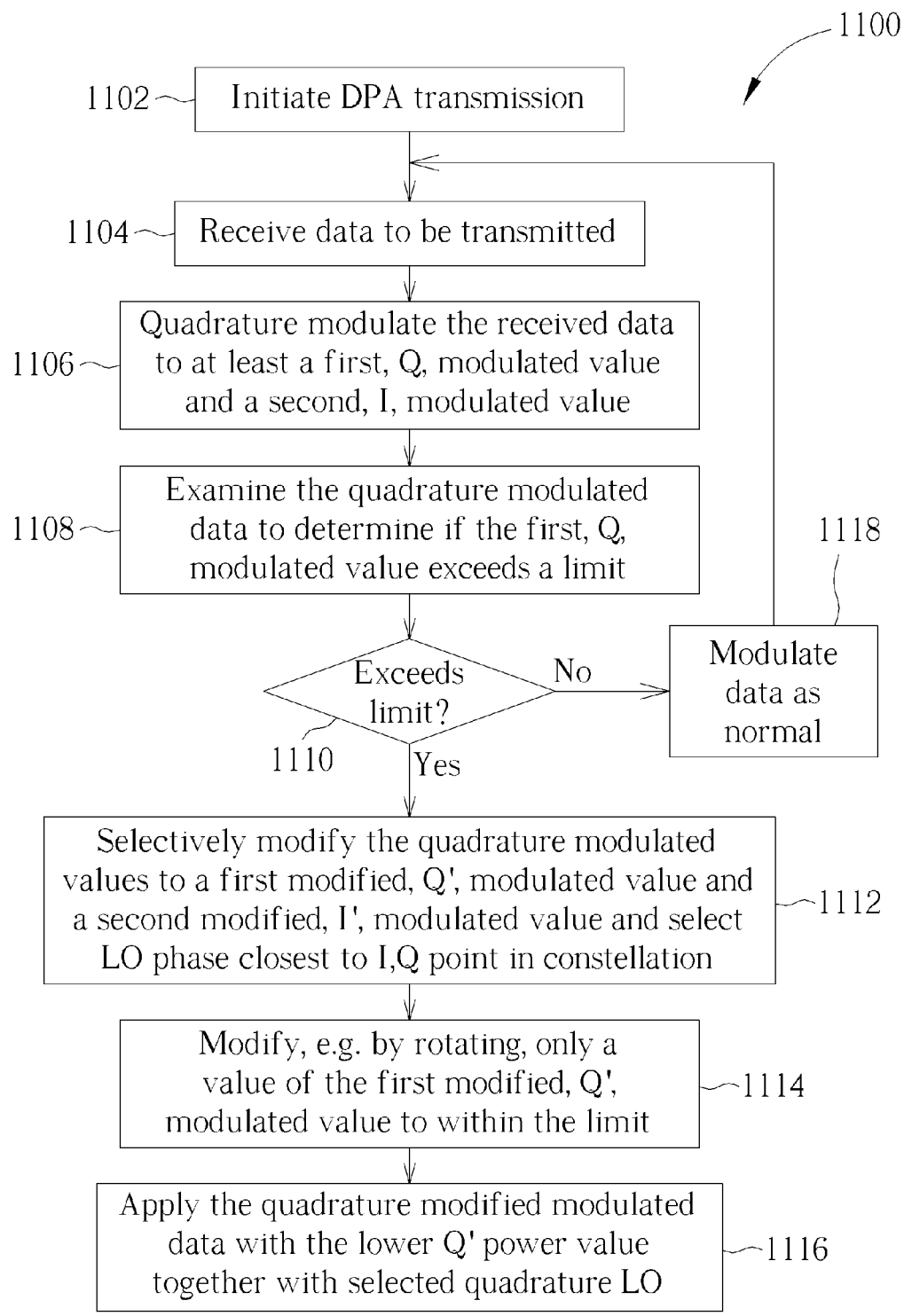
FIG. 11 illustrates a flowchart for quadrature rotation of a constellation axis and effective quadrature de-rotation of data of a digital IQ PA according to examples of the present invention.

Referring now to the example flowchart 1100 of FIG. 11, a method for amplifying a complex quadrature signal is illustrated. In some examples, the flowchart 1100 performs quadrature rotation of a constellation axis and effective quadrature de-rotation of data of a digital IQ PA according to examples of the present invention. The flowchart 1100 comprises a DPA transmission being initiated in 1102. Data to be transmitted is received in 1104. The received data is quadrature modulated in 1106 to at least a first, Q, modulated value and a second, I, modulated value. the quadrature modulated data is then examined in 1108 to determine if the first, Q, modulated value exceeds a limit. If the first, Q, modulated value does not exceed a limit in 1110, the quadrature data (and constellation) stays unmodified/un-rotated in 1118 and the flowchart moves to the next quadrature data sample in 1104 again.

However, in response to the first, Q, modulated value exceeding a limit in 1110, the quadrature modulated values are selectively modified to a first modified, Q', modulated value and a second modified, I', modulated value in 1112. The modification may be effectively performed by selectively rotating the quadrature IQ constellation, thereby bringing only a value of the first modified, Q', modulated value to within the limit, in 1114. A local oscillator phase is selected to map the first modified, Q', modulated value and second modified, I', modulated value to desired quadrature values. The quadrature modified modulated data with a lower Q' power value is then applied in 1116 together with the selected LO. In this step, the value of I' is modified from the value of I.

In this manner, a hybrid approach between polar digital PA and an IQ PA is described. In example embodiments, the amplitude modulation path bandwidth is expanded, which does not create a problem as it is achieved using IQ DPA. Furthermore, the phase modulation path bandwidth expansion does not require the VCO tuning range (BW) to be expanded purely from the modulation characteristics. That is, the BW expansion of the VCO in the described architecture and method is much less than with a polar design, thereby making it practical for the fourth generation (4G) multimode cellular standard that is being developed. In some examples, the phase modulation may be partitioned between a multiplexer selection (MUXSEL) arrangement and PLL phase rotation, in order to limit phase jump needed by the PLL. In some examples, a two-point modulation may be used to perform the phase change using PLL.

In the forgoing specification, an invention has been described with reference to specific illustrated examples. It will, however, be evident that various modifications and changes may be made therein without departing from the scope of the invention as set forth in the appended claims.

It is noteworthy that the proposed digital quadrature rotation (DQR) technique can be applied to most digital transmitter architectures supporting digital IQ data. The proposed DQR technique can utilise any phase adjustment circuit, e.g. a digital PLL, or an analog PLL supporting two-point modulation. The proposed DQR technique can be utilised with various DPA architectures, e.g. one that uses independent IDPA and QDPA or one that uses a combined DPA that applies I, Q, −I, −Q, I, Q, . . . , at its input to implement the spatial combining of I and Q data.

The connections as discussed herein may be any type of connections suitable to transfer signals from or to the respective nodes, units or devices, for example via intermediary components. Accordingly, unless implied or stated otherwise, the connections may for example be direct connections or indirect connections. The connections may be illustrated or described in reference to being a single connection, a plurality of connections, unidirectional connections or bidirectional connections. However, different illustrated examples may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively 'associated such that the desired functionality is achieved. Hence, any two components herein combined to achieve a particular functionality can be 'associated with' each other such that the desired functionality is achieved, irrespective of architectures or intermediary components. Likewise, two components so associated can also be viewed as being 'operably connected', or 'operably coupled' to each other to achieve the desired functionality.

Furthermore, those skilled in the art will recognise that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Furthermore, the illustrated examples may be implemented as circuitry located in a single integrated circuit or within the same device. Alternatively, the illustrated examples may be implemented as any number of separate integrated circuits or separate devices interconnected with each other in a suitable manner. However, other modifications, variations and alternatives are also possible. The specifications and drawings are, accordingly, to be regarded in an illustrative rather than in a restrictive sense.

It will be appreciated that, for clarity purposes, the above description has described embodiments of the invention with reference to different functional units and processors. However, it will be apparent that any suitable distribution of functionality between different functional units or processors, for example with respect to the digital quadrature modulator, frequency generation components, and digital PA, may be used without detracting from the invention. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved transmitter circuit, wireless communication unit, and method for amplifying a complex signal have been described, wherein the aforementioned disadvantages with prior art arrangements have been substantially alleviated.

What is claimed is:

1. A transmitter circuit comprising:
a frequency generation circuit configured to generate a local oscillator signal; and
a digital quadrature modulator coupled to the frequency generation circuit and configured to:
receive data to be transmitted;
quadrature modulate the received data to at least a first, Q, modulated value and a second, I, modulated value;
examine the quadrature modulated data to determine if the first, Q, modulated value exceeds a limit, and in response thereto
selectively modify the quadrature modulated values to a first modified, Q', modulated value and a second modified, I', modulated value thereby bringing only a value of the first modified, Q', modulated value to within the limit;
select and apply a phase of the local oscillator signal to map the first modified, Q', modulated value and second modified, I', modulated value to desired quadrature values.

2. The transmitter circuit of claim 1 wherein the digital quadrature modulator is configured to selectively modify the first, Q', modulated value to within the limit by applying a first quadrature control word to a 'Q' quadrature portion of a digital power amplifier (DPA) to generate a first quadrature power, wherein the first quadrature power is lower than a second quadrature power that would have been generated by amplifying the first, Q, modulated value.

3. The transmitter circuit of claim 2 wherein the digital quadrature modulator is configured to apply the first quadrature control word to the DPA such that a reduced number of power cell arrays of the 'Q' quadrature portion of the DPA is selected in order to produce a smaller phase change using the first modified, Q', modulated value than would have been for amplifying the first, Q, modulated value.

4. The transmitter circuit of claim 3 wherein the digital quadrature modulator is configured to apply the limit such that the DPA applies a first amplification and phase change to generate first modified, Q', modulated value that is lower than a second amplification and phase change to generate the second modified, I', modulated value.

5. The transmitter circuit of claim 1 wherein the frequency generation circuit comprises a local oscillator, LO, and a phase locked loop, PLL, configured to generate the LO signal, wherein a coarse phase change of a PLL output provides an additional phase change to further modify the quadrature modulated values.

6. The transmitter circuit of claim 1 wherein the digital modulator quadrature is configured to modulate the received data to a first, Q, modulated value and a second, I, modulated value in a first constellation and is configured to examine the quadrature modulated data to determine if the first, Q, modulated value exceeds the limit on a first constellation axis, and in response thereto the digital modulator is configured to selectively modify the quadrature modulated values to a first, Q', modulated value and a second modified, I', modulated value to bring only the first modified, Q', modulated value to within the limit as applied to a second constellation axis.

7. The transmitter circuit of claim 6 wherein the digital modulator is configured to selectively modify the quadrature modulation values by rotating quadrature axes of the first constellation to form new axes of the second constellation.

8. The transmitter circuit of claim 7 wherein the digital modulator is configured to rotate the axes of the first constellation by applying a control signal to at least one from a group of: a multiplexer selection switch, a digital phase locked loop, PLL, an analog PLL supporting two-point modulation.

9. The transmitter circuit of claim 1 further comprising a digital power amplifier, DPA, comprises multiple quadrature DPAs, QDPAs, each QDPA configured to amplify respectively quadrature modified modulated data, wherein one or more first QDPA employs less current to amplify the first modified, Q', modulated value than one or more second QDPA amplifying the second modified, I', modulated value.

10. The transmitter circuit of claim 9 wherein the multiple QDPAs output multiple modulated signals to a digital quadrature combiner and the frequency generation circuit is coupled to a selectable multiplexer configured to provide a selectable local oscillator phase to the multiple QDPAs, and wherein the digital quadrature modulator is configured to output a phase control signal to the frequency generation circuit, such that a LO phase selected by the phase control signal effects a fine phase control of the LO signal output from the frequency generation circuit.

11. The transmitter circuit of claim 10 wherein the digital quadrature modulator is configured to apply a coarse phase modulation to a phase selector operably coupled to the selectable multiplexer thereby selecting the local oscillator phase to be applied to each of the multiple QDPAs.

12. The transmitter circuit of claim 9 wherein the DPA comprises a combined DPA and the frequency generation circuit is coupled to a selectable multiplexer configured to provide a selectable local oscillator signal phase by rotating through LO phases such that the desired output phase from the combined DPA implements spatial combining of at least the first modified, Q', modulated value and second modified, I', modulated value.

13. The transmitter circuit of claim 12 wherein the digital quadrature modulator is configured to output a phase control signal to the frequency generation circuit, such that the phase control signal applies a fine phase control signal to the PLL of the frequency generation circuit and a coarse phase modulation to an axis selector coupled to the selectable multiplexer thereby selecting a constellation axis to be used in generating modified quadrature data.

14. The transmitter circuit of claim 13 wherein the digital quadrature modulator is coupled to a second selectable multiplexer configured to select a phase of the local oscillator signal to be applied to the combined DPA.

15. A communication unit comprising a transmitter circuit comprising:
 a frequency generation circuit configured to generate a local oscillator signal; and
 a digital quadrature modulator coupled to the frequency generation circuit and configured to:
  receive data to be transmitted;
  quadrature modulate the received data to at least a first, Q, modulated value and a second, I, modulated value;
  examine the quadrature modulated data to determine if the first, Q, modulated value exceeds a limit, and in response thereto
  selectively modify the quadrature modulated values to a first modified, Q', modulated value and a second modified, I', modulated value thereby bringing only a value of the first modified, Q', modulated value to within the limit;
  select a local oscillator phase to map the first modified, Q', modulated value and second modified, I', modulated value to desired quadrature values.

16. A method for amplifying a complex quadrature signal; the method comprising:
 receiving data to be transmitted;
 quadrature modulating the received data to at least a first, Q, modulated value and a second, I, modulated value;
 examining the quadrature modulated data to determine if the first, Q, modulated value exceeds a limit, and in response thereto
 selectively modifying the quadrature modulated values to a first modified, Q', modulated value and a second modified, I', modulated value thereby bringing only a value of the first modified, Q', modulated value to within the limit;
 selecting a local oscillator phase to map the first modified, Q', modulated value and second modified, I', modulated value to desired quadrature values; and
 amplifying the quadrature modified modulated data.

17. The method of claim 16 further comprising quadrature modulating the received data to a first, Q, modulated value and a second, I, modulated value in a first constellation and examining the quadrature modulated data to determine if the first, Q, modulated value exceeds a constellation limit, and in response thereto selectively modifying the quadrature modulated values to a first, Q', modulated value and a second modified, I', modulated value to bring only the first modified, Q', modulated value to within the limit as applied to a second constellation.

18. The method of claim 17 further comprising selectively modifying the quadrature modulation values by rotating quadrature axes of the first constellation to the second constellation.

19. The method of claim 16 further comprising determining if the first, Q, modulated value exceeds a limit and modifying the quadrature modulated values to the first modified, Q', modulated value to within the limit such that less power in the quadrature modified modulated data is input to the DPA.

* * * * *